US012811391B2

(12) United States Patent
Mysore Rajagopal et al.

(10) Patent No.: US 12,811,391 B2
(45) Date of Patent: Nov. 24, 2026

(54) QUASI-STATIC ESD CLAMP

(71) Applicant: TEXAS INSTRUMENTS INCORPORATED, Dallas, TX (US)

(72) Inventors: Krishna Praveen Mysore Rajagopal, Manteca, CA (US); James Di Sarro, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 30 days.

(21) Appl. No.: 18/477,626

(22) Filed: Sep. 29, 2023

(65) Prior Publication Data

US 2024/0372356 A1 Nov. 7, 2024

Related U.S. Application Data

(60) Provisional application No. 63/499,393, filed on May 1, 2023.

(51) Int. Cl.

*H02H 9/04* (2006.01)
*H05K 9/00* (2006.01)
*H10D 89/60* (2025.01)

(52) U.S. Cl.

CPC ............. *H02H 9/04* (2013.01); *H05K 9/0067* (2013.01); *H10D 89/817* (2025.01); *H10D 89/911* (2025.01)

(58) Field of Classification Search

CPC ...... H02H 9/04; H05K 9/0067; H10D 89/817; H10D 89/911; H10D 89/819

See application file for complete search history.

(56) References Cited

U.S. PATENT DOCUMENTS 5,825,601 A * 10/1998 Statz .................... H10D 89/811 361/111
8,059,375 B2 * 11/2011 Fehle .................. H10D 89/811 361/111
8,199,447 B2 * 6/2012 Gee ........................ H02H 9/046 361/56
9,172,241 B2 * 10/2015 Chen ....................... H02H 9/046
10,840,237 B2 * 11/2020 Tsai ..................... H10D 89/819
2003/0201457 A1 * 10/2003 Lin ...................... H10D 89/811 257/173
2007/0183104 A1 * 8/2007 Tseng ................... H10D 89/819 361/56
2008/0043389 A1 * 2/2008 Fehle ..................... H02H 9/046 361/56

(Continued)

*Primary Examiner* — Thienvu V Tran
*Assistant Examiner* — Muaamar Qahtan Al-Taweel
(74) *Attorney, Agent, or Firm* — Andrew R. Ralston; Charles F. Koch

(57) ABSTRACT

An integrated circuit includes first, second and third transistors, and an RC circuit. The first transistor is connected between a power supply terminal and a reference terminal. The first transistor has a first control terminal. The second transistor is connected between the power supply terminal and the first control terminal. The second transistor has a second control terminal. The third transistor is connected between the first control terminal and the reference terminal. The RC circuit includes a resistor and a capacitor connected to the second control terminal and configured to turn on the first transistor responsive to a rise time of voltage of the power supply terminal being less than a predetermined threshold.

21 Claims, 8 Drawing Sheets

(56) References Cited

U.S. PATENT DOCUMENTS

| | | | | |
|---|---|---|---|---|
| 2012/0182654 | A1* | 7/2012 | Wang | H02H 9/046<br>361/56 |
| 2013/0258533 | A1* | 10/2013 | Chen | H02H 9/046<br>361/56 |
| 2016/0372457 | A1* | 12/2016 | Reinprecht | H02H 9/046 |

* cited by examiner

QUASI-STATIC ESD CLAMP

CROSS-REFERENCE TO RELATED APPLICATIONS

This application claims priority to U.S. Provisional Application No. 63/499,393, filed May 1, 2023, entitled "Quasi-Static ESD Clamp to Mitigate In-rush Current," which is hereby incorporated by reference.

BACKGROUND

Integrated circuits (ICs) may be severely damaged by electrostatic discharge (ESD) phenomena. An IC may be exposed to ESD from many sources. A major source of ESD exposure to ICs is from the human body, and is known as the Human Body Model (HBM) ESD source. A charge of about 0.2 micro-coulombs can be induced on a human body having a capacitance of 100 pF, leading to electrostatic potentials of 2 kV or greater. Any contact by a charged human body with a grounded object, such as a terminal of an IC, can result in a discharge for about 100 nano-seconds with peak currents of several amperes to the IC.

A second ESD model is the charged device model (CDM). Unlike the HBM ESD source, the CDM ESD source includes situations where the IC itself becomes charged and discharges to ground when any of its pins makes contact to a grounded conductive object. Thus, a CDM discharge requires only one IC pin to be contacted, whereas an HBM discharge requires at least two IC pins to be contacted. CDM pulses also have very fast rise times compared to the HBM ESD source.

Because of high electrostatic voltages resulting in large ESD currents on the one hand and low breakdown voltages of IC components on the other hand, the problem of ESD with IC components can be severe. Therefore, the terminals of an IC usually have an integrated protection device connected between the terminal and the internal circuits which allows the ESD current to be shunted to an alternative current path, e.g., to ground, to clamp the induced overvoltage and protect the active internal circuits from damage.

SUMMARY

In one example, an integrated circuit includes first, second and third transistors, and an RC circuit. The first transistor is connected between a power supply terminal and a reference terminal. The first transistor has a first control terminal. The second transistor is connected between the power supply terminal and the first control terminal. The second transistor has a second control terminal. The third transistor is connected between the first control terminal and the reference terminal. The RC circuit includes a resistor and a capacitor connected to the second control terminal and configured to turn on the first transistor responsive to a rise time of voltage of the power supply terminal being less than a predetermined threshold.

In another example, a method includes forming first, second, and third transistors, a resistor, and a capacitor over or extending into a semiconductor substrate, and forming one or more interconnect layers. The first transistor has a first control terminal. The second transistor has a second control terminal. The third transistor has a third control terminal. The method also includes, in the interconnect layers, connecting the first transistor to a power supply terminal and to a reference terminal, connecting the second transistor to the power supply terminal and to the first control terminal, connecting the third transistor to the first control terminal and to the reference terminal, connecting the resistor between the power supply terminal and the second control terminal, and connecting the capacitor between the second control terminal and the reference terminal.

In another example, an integrated circuit includes a core circuit and an electrostatic discharge (ESD) protection circuit. The core circuit and the ESD protection circuit are coupled between a power supply terminal and a reference terminal. The ESD protection circuit includes an ESD protection transistor, a first pull-down stage, and a second pull-down stage. The ESD protection transistor is connected between the power supply terminal and the reference terminal. The ESD protection transistor has a control terminal. The first pull-down stage has a first transistor and a first resistor connected in series at a first node between the power supply terminal and the reference terminal. The first node is connected to the control terminal of the ESD protection transistor. The second pull-down stage has a second transistor and a second resistor connected in series at a second node between the power supply terminal and the reference terminal. The second node is connected to the control terminal of the ESD protection transistor.

In another example, an integrated circuit includes a first transistor, first circuit components and second circuit components. The first transistor is directly connected between a positive voltage rail and a reference voltage rail. The first circuit components are configured to turn on the first transistor in the event the voltage of the positive voltage rail has a rise time less than a predetermined value. The second circuit components are configured to turn off the first transistor in the event the voltage of the positive voltage rail has a rise time greater than the predetermined value.

In another example, an integrated circuit includes a first, second, and third transistors, and an input filter. The first transistor is directly connected between a positive voltage rail and a reference voltage rail and has a gate input. The input filter is configured to produce a control voltage indicative of a rate of increase of a voltage on the positive voltage rail. The second transistor is connected to the gate input of the first transistor and is configured to control the first transistor to a low resistance state in the event the rate of increase indicates an ESD state of the positive voltage rail. The third transistor is connected to the gate input of the first transistor and is configured to control the first transistor to a high resistance state in the event the rate of increase indicates a power-up state of the positive voltage rail.

In another example, an integrated circuit includes first, second, and third transistors, and a low-pass filter. The first transistor is directly connected between a positive voltage rail and a reference voltage rail and has a gate input. The a low-pass filter is connected between the positive voltage rail and the reference voltage rail and has a filtered node. The second transistor is connected between the positive voltage rail and the gate input. The third transistor is connected between the gate input and the reference voltage rail. The second and third transistors are configured to turn on the first transistor only in the event the voltage at the filtered node has a rise time below a predetermined threshold.

DETAILED DESCRIPTION

Figure 1:
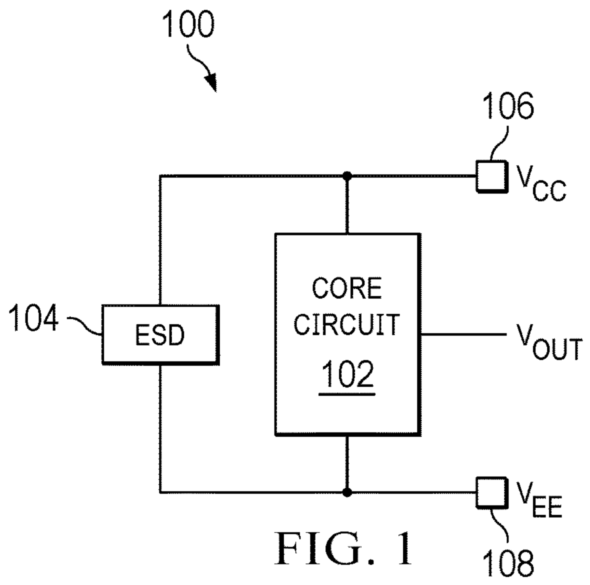
FIG. 1 is a block diagram of an example circuit with electrostatic discharge (ESD) protection.

FIG. 1 is a block diagram of an example circuit 100 with electrostatic discharge (ESD) protection. The circuit 100 includes a core circuit 102 and an ESD protection circuit 104. The core circuit 102 is powered by voltages $V_{CC}$ and $V_{EE}$ provided at a power supply terminal 106 (also referred to as a positive voltage rail) and a reference terminal 108 (also referred to as a reference voltage rail) respectively. The core circuit 102 may provide an output signal (Vout) for use by other circuits. For example, Vout may be a transistor control signal in some circuits. To reduce power consumption, an operational voltage may be provided at the power supply terminal 106 and reference terminal 108 only as needed. The slew rate of the power supply voltage may be relatively high (e.g., 0.36 volts per nanosecond).

The ESD protection circuit 104 is coupled to the power supply terminal 106 and the reference terminal 108 in parallel with the core circuit 102. The ESD protection circuit 104 senses the increase in voltage across the power supply terminal 106 and the reference terminal 108 that is characteristic of an electrostatic discharge event (ESD event). On detection of an ESD event, the ESD protection circuit 104 provides a path for current flow between the power supply terminal 106 and the reference terminal 108 to limit the voltage across the core circuit 102. The ESD protection circuit 104 may limit the voltage across the core circuit 102 to a value selected to reduce the likelihood of overvoltage damage. For example, with internal circuitry rated for a maximum power supply voltage of 36 volts, the ESD protection circuit 104 may limit the voltage across the core circuit 102 to less than 36 volts during an ESD event. Some ESD circuits may limit the voltage across the ESD protection circuit 104 to a higher value that increases the likelihood of damage to the ESD protection circuit 104.

While the slew rate of the power supply voltage provided at the power supply terminal 106 and reference terminal 108 during operation may be relatively fast, the ESD protection circuit 104 may remain inactive during ramp up of the power supply voltage to avoid potential circuit damage due to shunting of power supply current. Other ESD protection circuits may be activated by the increase in power supply voltage, and potentially damaged by the high current conducted.

Figure 2:
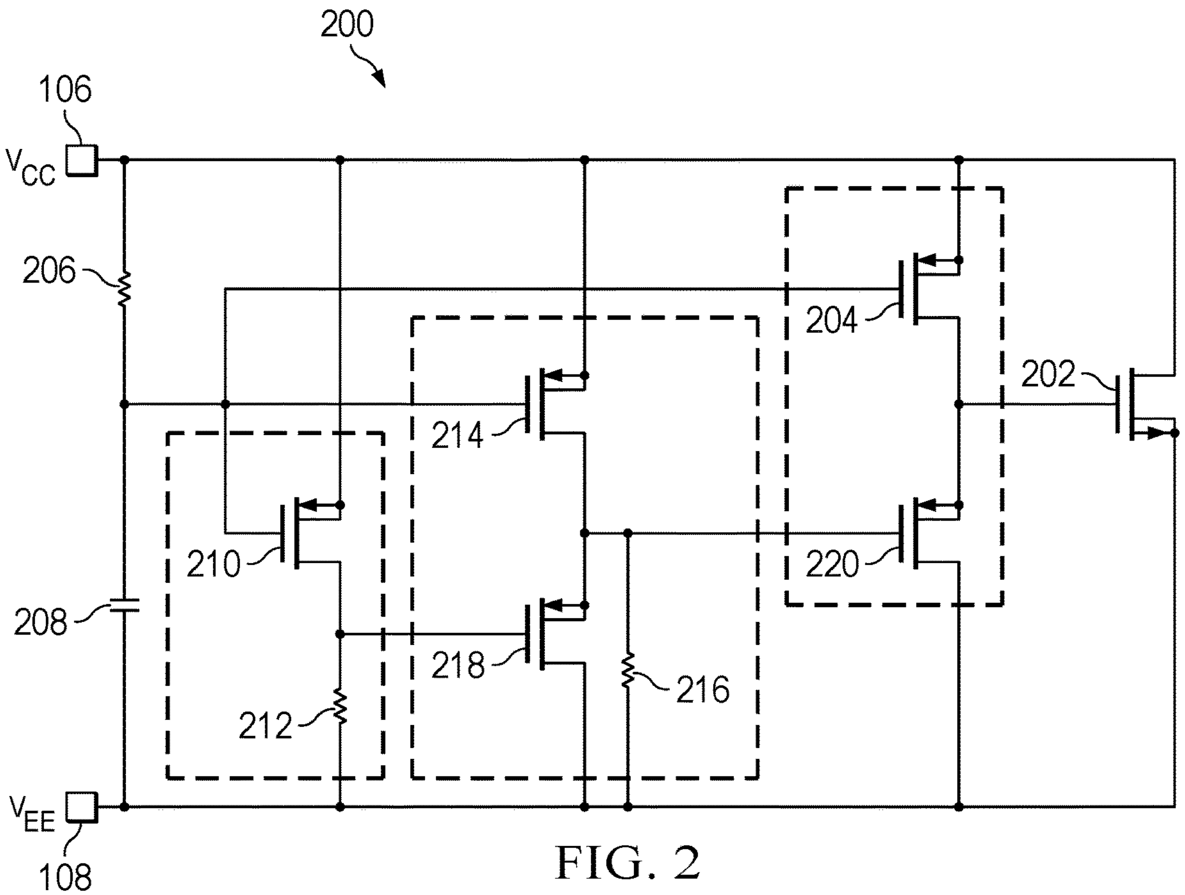
FIG. 2 is a schematic diagram of an example ESD protection circuit suitable for use in the circuit of FIG. 1.

FIG. 2 is a schematic diagram of an example ESD protection circuit 200. The ESD protection circuit 200 is an example of the ESD protection circuit 104. The ESD protection circuit 200 includes a first transistor 202, a second transistor 204, a third transistor 220, a fourth transistor 210, a fifth transistor 214, and a sixth transistor 218, first resistor 206, second resistor 212, and third resistor 216, and a capacitor 208. The transistor 202 may be larger than the transistors 204, 210, 214, 218, and 220. The transistor 202 may be an n-type field effect transistor, such as an n-type drain-extended (FET). In some examples, the transistor 202 may have a total channel width of about 3500 micrometers and a channel length of about 1.3 micrometers in some examples. The transistors 204, 210, 214, 218, and 220 may be p-type FETs (e.g., p-type drain-extended FETs), and may have a channel width of about 40 micrometers and a channel length of about 1.3 micrometers in some examples. Without implied limitation the transistors 202, 204, 210, 214, 218, and 220 are symbolized as drain-extended FETs.

The transistor 202 operates as an ESD protection transistor and is coupled between the power supply terminal 106 and the reference terminal 108. A first current terminal (e.g., drain) of the transistor 202 is coupled to the power supply terminal 106 and a second current terminal (e.g., source) of the transistor 202 is coupled to the reference terminal 108. The transistor 202 may be turned on during an ESD event to conduct current from the power supply terminal 106 to the reference terminal 108.

The transistor 204 is coupled between the power supply terminal 106 and a control terminal (e.g., gate) of the transistor 202. A first current terminal (e.g., source) of the transistor 204 is coupled to the power supply terminal 106 and a second current terminal of the transistor 204 is coupled to the control terminal of the transistor 202. The transistor 204 may be turned on during an ESD event to conduct current to the control terminal of the transistor 202.

The resistor 206 and the capacitor 208 are coupled in series, as an RC circuit, between the power supply terminal 106 and the reference terminal 108. In this configuration of the resistor 206 and the capacitor 208 behave as a low-pass filter with respect to the voltage at their shared circuit node, referred to herein as the "RC node". The resistor 206 is coupled between the power supply terminal 106 and a control terminal (e.g., gate) of the transistor 204. The capacitor 208 is coupled between the control terminal of the transistor 204 and the reference terminal 108. The values of the resistor 206 and the capacitor 208 may be selected such that during an ESD event the voltage at the power supply terminal 106 rises substantially more quickly than the voltage at the control terminal of the transistor 204. Under such conditions, the transistor 204, as a p-type FET, connects the gate of the transistor 202 to the power supply terminal 106 and thus turns on the transistor 202. Accordingly, the transistor 202 may be turned on if the rise time of voltage of the power supply terminal 106 is less than a predetermined threshold. Rise time may be defined as increase in the voltage from about 10% to about 90% of the steady-state operational power supply voltage. In some examples, the threshold may be multiple of (e.g., 2.2 times) the time constant of the RC circuit.

The values of the resistor 206 and the capacitor 208 may also be selected such that during application of operational power supply voltage between the power supply terminal 106 and reference terminal 108, the voltage at the power supply terminal 106 does not rise substantially more quickly than the voltage at the control terminal of the transistor 204, which prevents the transistor 204 and the transistor 202 from turning on. In some examples, the capacitor 208 may have a capacitance of about 250 femto-farads, and the resistor 206 may have a resistance of about 4.5 kilo-ohms.

The transistor 220 is coupled in series with the transistor 204 between the power supply terminal 106 and the reference terminal 108. A first current terminal (e.g., source) of the transistor 220 is coupled to the control terminal of the transistor 202 and to the second current terminal of the transistor 204. A second current terminal (e.g., drain) of the transistor 220 is coupled to the reference terminal 108. The transistor 220 may be turned on to pull-down the control terminal of the transistor 202, and turn off the transistor 202.

The transistor 214 and the transistor 218 are coupled in series between the power supply terminal 106 and the reference terminal 108. The transistor 218 may be turned on to turn on the transistor 220, and the transistor 214 may be turned on to turn off the transistor 220. The transistor 214 is coupled between the power supply terminal 106 and the control terminal of the transistor 220. A first current terminal (e.g., source) of the transistor 214 is coupled to the power supply terminal 106 and a second current terminal (e.g., drain) of the transistor 214 is coupled to the control terminal of the transistor 220. A control terminal (e.g., gate) of the transistor 214 is coupled to the control terminal of the transistor 204. A first current terminal (e.g., source) of the transistor 218 is coupled to the second current terminal of the transistor 214 and the control terminal of the transistor 220. A second current terminal (e.g., drain) of the transistor 218 is coupled to the reference terminal 108. The resistor 216 is coupled between the control terminal of the transistor 220 and the reference terminal 108 in parallel with the transistor 218. The resistor 216 may have a resistance of about 600 kilo-ohms in some examples.

The transistor 210 and the resistor 212 are coupled in series between the power supply terminal 106 and the reference terminal 108. The transistor 210 may be turned on to turn off the transistor 218. The transistor 210 is coupled between the power supply terminal 106 and the control terminal of the transistor 218. A first current terminal (e.g., source) of the transistor 210 is coupled to the power supply terminal 106 and a second current terminal (e.g., drain) of the transistor 210 is coupled to the control terminal of the transistor 218. A control terminal (e.g., gate) of the transistor 210 is coupled to the control terminal of the transistor 204. The resistor 212 is coupled between the second current terminal of the transistor 210 and the reference terminal 108. The resistor 212 may have a resistance of about 600 kilo-ohms in some examples.

Figure 3:
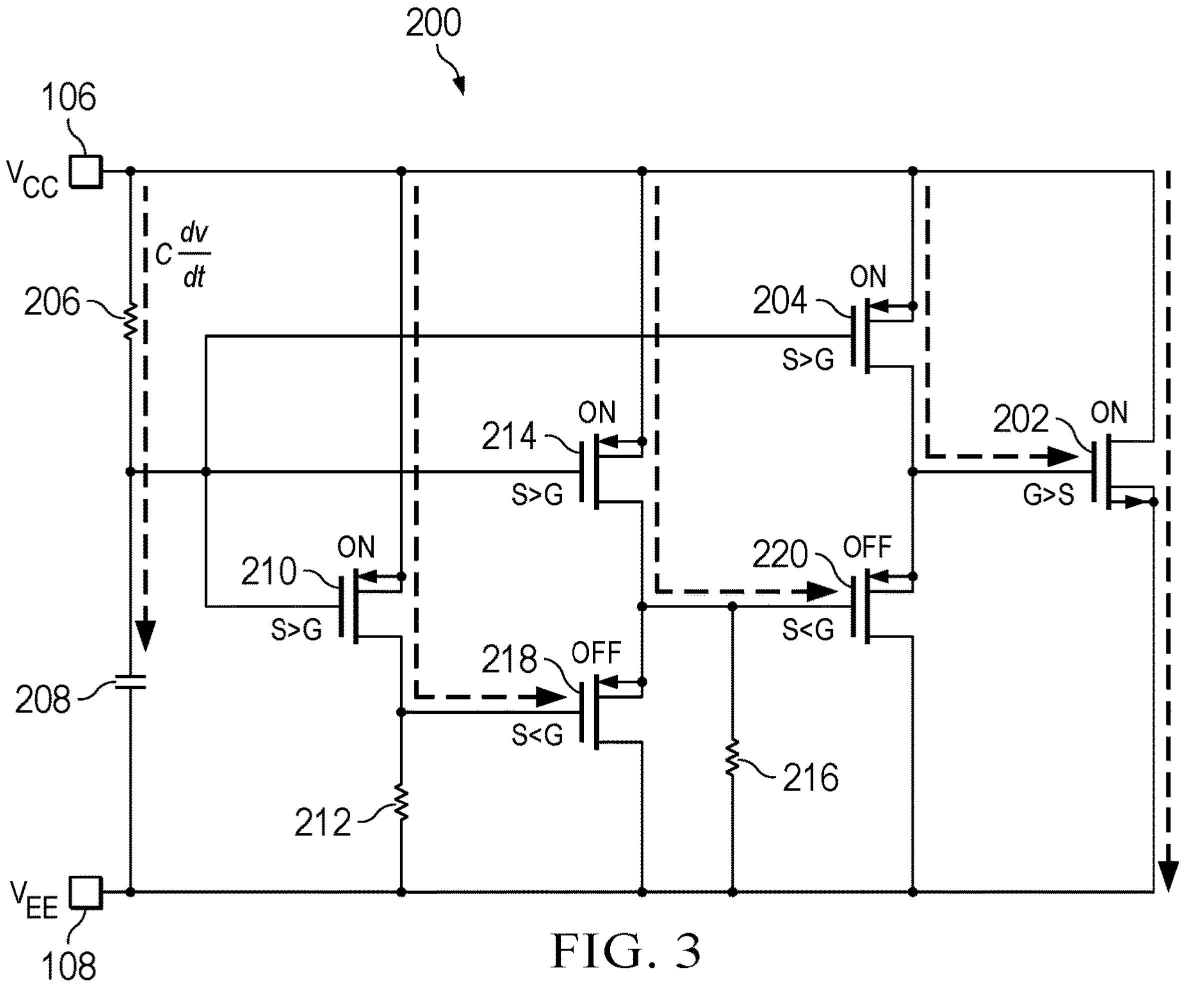
FIG. 3 illustrates operation of the ESD protection circuit of FIG. 2 during an ESD event.

FIG. 3 illustrates operation of the ESD protection circuit 200 during an ESD event. Prior to the ESD event, there is little or no voltage across the resistor 206, the transistors 202, 204, and 214 are off, and the transistors 218 and 220 are on. The ESD event causes the voltage at the power supply terminal 106, and the voltage across the resistor 206, to increase relatively quickly (e.g., 5-10 nanosecond rise time with a slew rate of 2.5-5 volts per nanosecond). Current flows through the resistor 206 to charge the capacitor 208.

$$i_{disp} = C\frac{dv}{dt} \tag{1}$$

where $i_{disp}$ is the current flowing through the resistor 206, and C is the capacitance of the capacitor 208.

Due to the low-pass characteristic of the resistor 206 and the capacitor 208, the voltage at the RC node is initially less than that of the power supply terminal 106, and thus the transistor 204, the transistor 210, and the transistor 214 are initially turned on. The gate-to-source voltage $v_{gs}$ of the transistor 204, the transistor 210, and the transistor 214 may be expressed as $$|v_{gs}| = \left[R * C\left(\frac{dv}{dt}\right)\right] > |v_{th}| \tag{2}$$

where R is the resistance of the resistor 206, and $v_{th}$ is the threshold voltage of the transistor 204, the transistor 210, and the transistor 214.

Current flows through the transistor 210 and the transistor 214 to turn off the transistor 218 and the transistor 220. The current may be expressed as:

$$I_{dsat} \propto \frac{w}{\ell} * (|vgs| - |vth|)^2 \tag{3}$$

where $I_{dsat}$ is saturation mode current in the transistors 210 and 214, and w and l are channel width and length of the transistors 210 and 214.

For the transistor 218:

$$[|(I_{dsat} * R0) - (I_{dsat} * R1)|] < |v_{th}| \tag{4}$$

where R0 is the resistance of the resistor 212 and R1 is the resistance of the resistor 216.

For the transistor 220:

$$[|(I_{dsat} * R1) - (v_{gs\_202})|] < |v_{th}| \tag{5}$$

Current flows through the transistor 204 to increase the gate voltage of the transistor 202 and turn on the transistor 202.

$$v_{gs\_202} \gg v_{th} \tag{6}$$

With the transistor 202 turned on, current flows through the transistor 202 to reduce the voltage between the power supply terminal 106 and the reference terminal 108.

Figure 4:
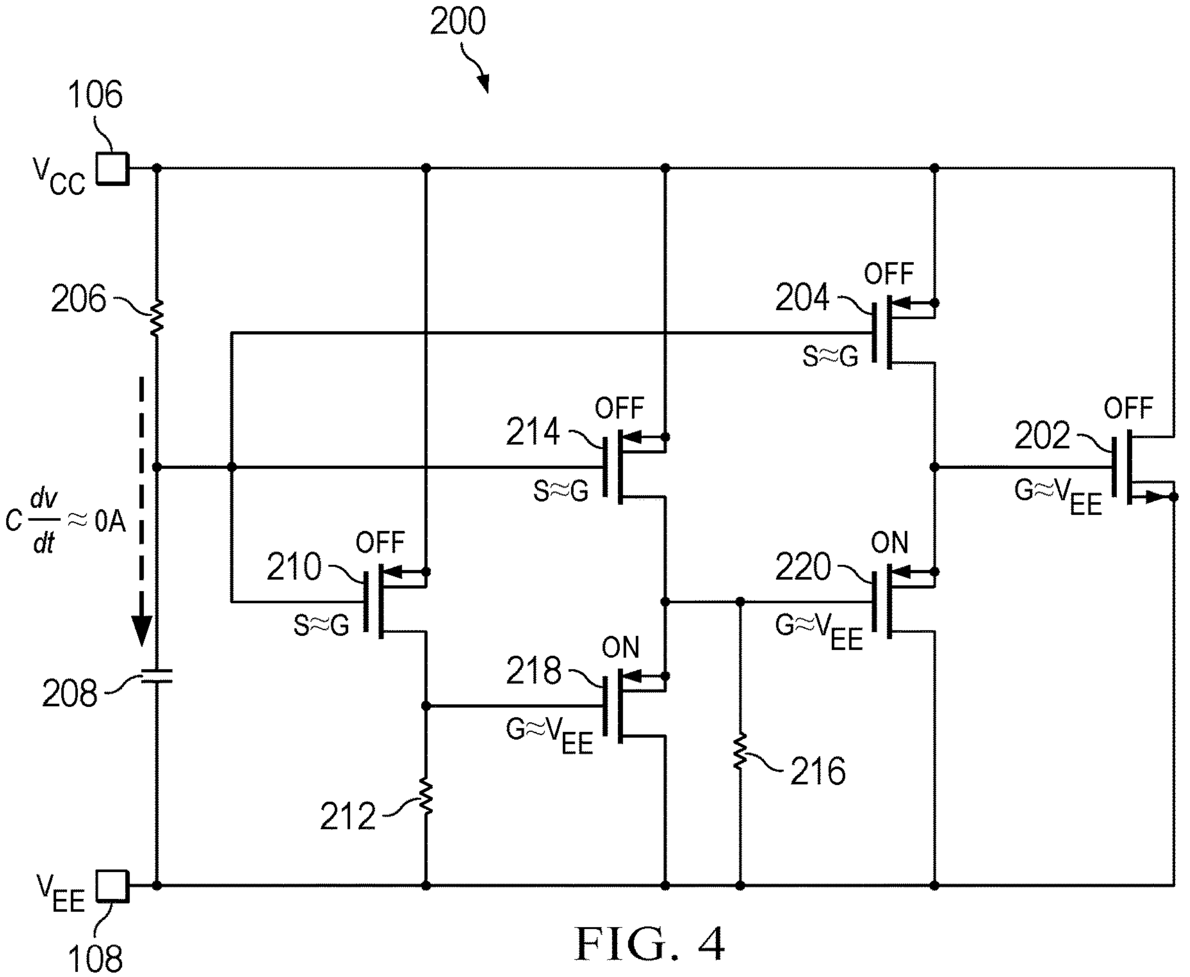
FIG. 4 illustrates operation of the ESD protection circuit of FIG. 4 during power-up.

FIG. 4 illustrates operation of the ESD protection circuit 200 during power-up. During power-up, the voltage at the power supply terminal 106 increases relatively slower as compared to an ESD event. Due to the low-pass characteristic of the resistor 206 and the capacitor 208, the voltage at the RC node remains close to that of the power supply terminal 106, and thus and the transistors 204, 210, and 214 may remain turned off, or May turn on weakly and/or fleetingly. The control voltage applied to the transistors 204, 210, and 214 may be expressed as:

$$|v_{gs}| = \left[R * C\left(\frac{dv}{dt}\right)\right] < |v_{th}| \tag{7}$$

Current flow through the transistor 210 and the transistor 214 may be expressed as:

$$I_{dlin} \propto \frac{w}{l} * (|vgs| - |vth|) \quad (8)$$

where $I_{dlin}$ is linear mode current.

With little or no current flow through the transistor 210 and the transistor 214, the transistor 218 and the transistor 220 are turned on. For the transistor 218:

$$(I_{dsat} * R0) = (I_{dsat} * R1) \approx GND \quad (9)$$

For the transistor 220:

$$[|(I_{dsat} * R1) - (v_{gs\_202})|] > |v_{th}| \quad (10)$$

With the transistor 220 turned on, the transistor 202 is turned off the magnitude gate-to-source voltage of the transistor 202 is less than the magnitude of $v_{th}$, and little or no current flows between the power supply terminal 106 and the reference terminal 108 through the transistor 202.

Figure 5:
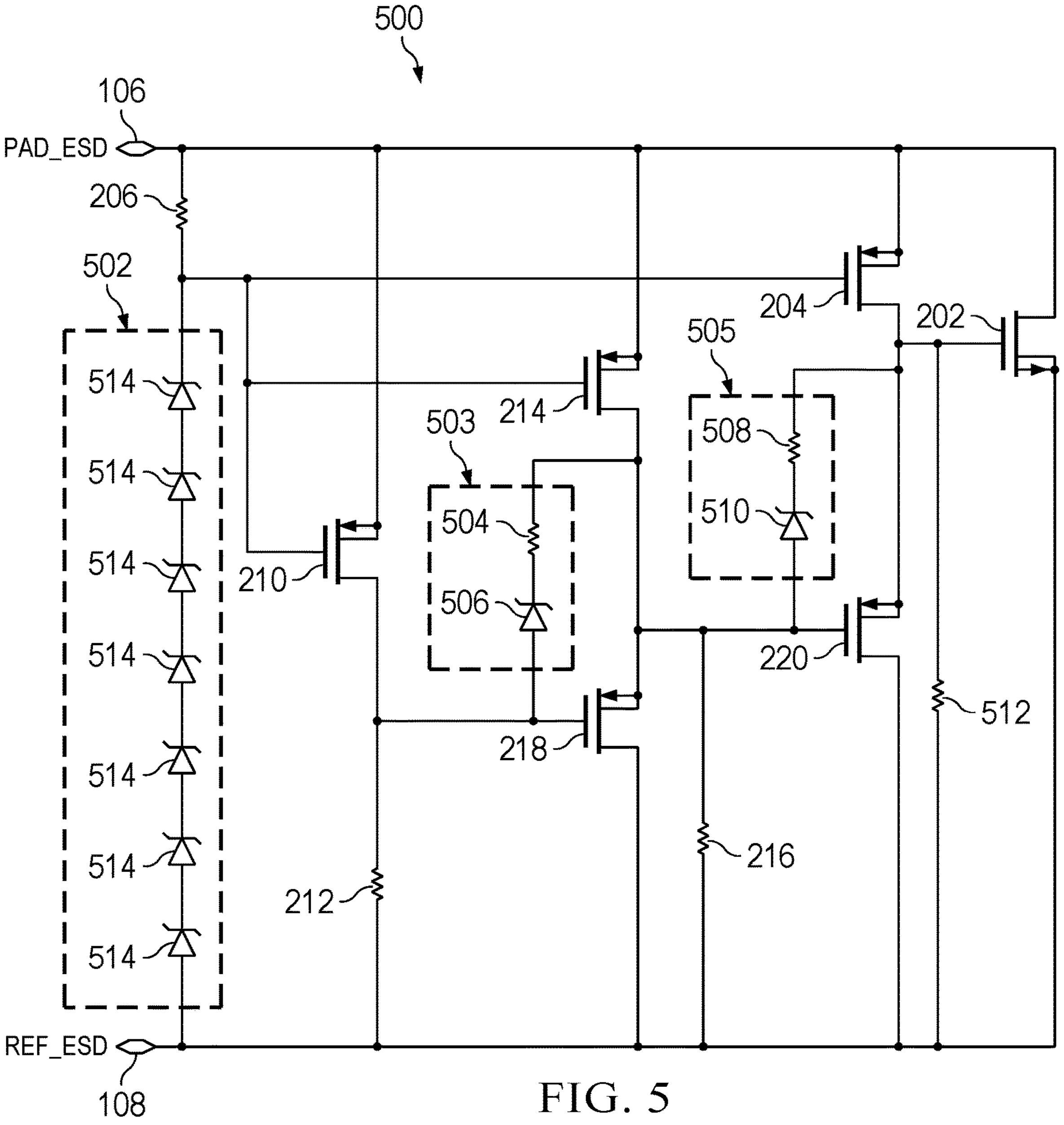
FIG. 5 is a schematic diagram of an example ESD protection circuit including safety features that is suitable for use in the circuit of FIG. 1.

FIG. 5 is a schematic diagram of an example ESD protection circuit 500 that includes additional safety features. The ESD protection circuit 500 is similar to the ESD protection circuit 200 and includes the transistors 202, 204, 210, 214, 218, and 220, and the resistors 206, 212, and 216, with operation as described with reference to FIGS. 2-4. The ESD protection circuit 500 also includes a Zener diode stack 502, a resistor 512, and Zener clamps 503 and 505. The Zener diode stack 502 is coupled between the resistor 206 and the reference terminal 108, and operates as the capacitor 208 while providing power supply overvoltage protection. The Zener diode stack 502 include multiple Zener diodes 514 (reverse-biased Zener diodes) coupled in series. While the Zener diode stack 502 is illustrated as including seven Zener diodes 514 coupled in series, examples of the Zener diode stack 502 may include any number of Zener diodes 514 coupled in series to provide a predetermined voltage characteristic at the RC node.

The Zener clamp 503 includes a resistor 504 and a Zener diode 506 coupled in series between the first current terminal and the control terminal of the transistor 218. The Zener clamp 505 includes a resistor 508 and a Zener diode 510 coupled in series between the first current terminal and the control terminal of the transistor 220. The Zener clamps 503 and 505 limit the voltage between the first current terminal and the control terminal of the transistor 218 and the transistor 220 to a selected value.

The resistor 512 is coupled between the control terminal of the transistor 202 and the reference terminal 108. The resistor 512 provides a path for current flow that allows the control terminal of the transistor 202 to be discharged when the transistor 202 is turned-off. The resistors 504, 508, and 512 may have a resistance of about 600 kilo-ohms in some examples.

Figure 6:
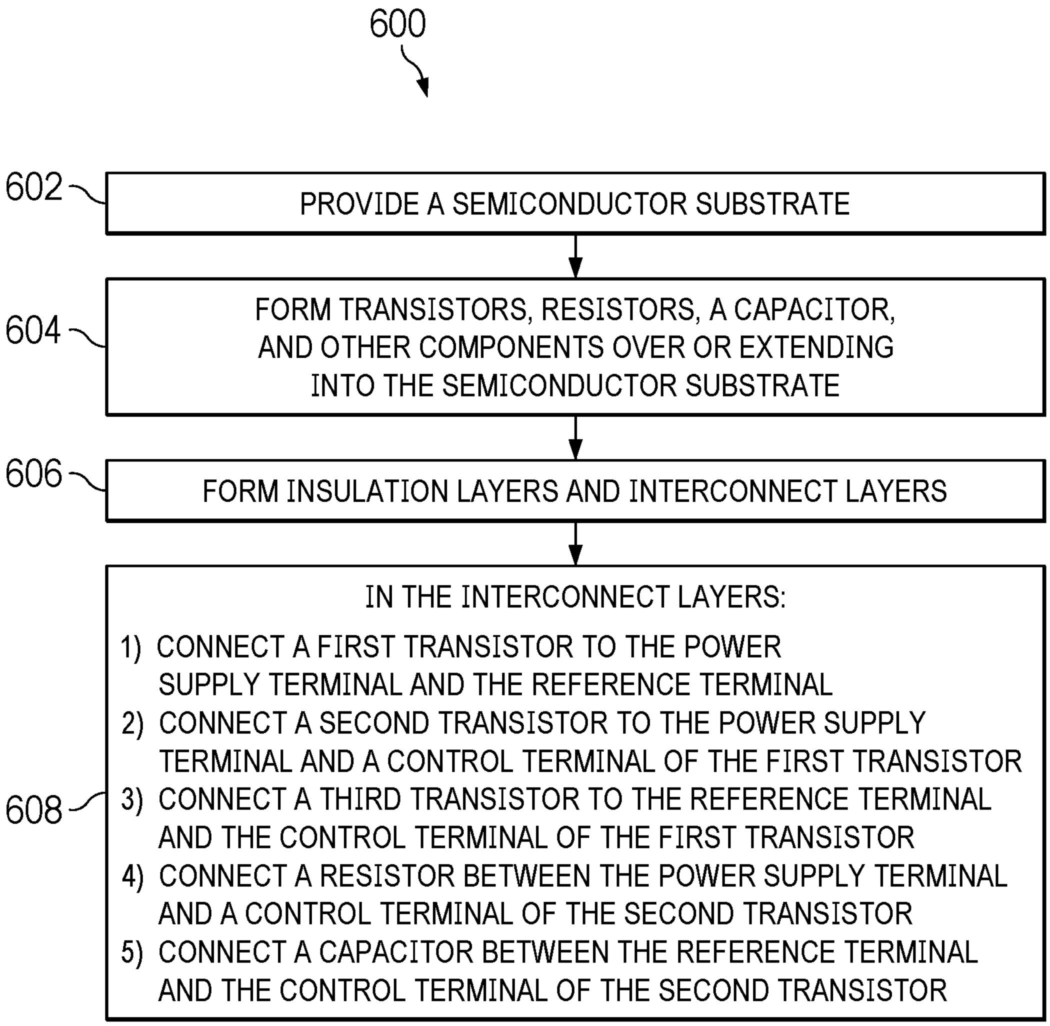
FIG. 6 is a flow diagram for a method of fabricating an integrated circuit including the ESD protection circuit of FIG. 2 or 5.
Figure 7:
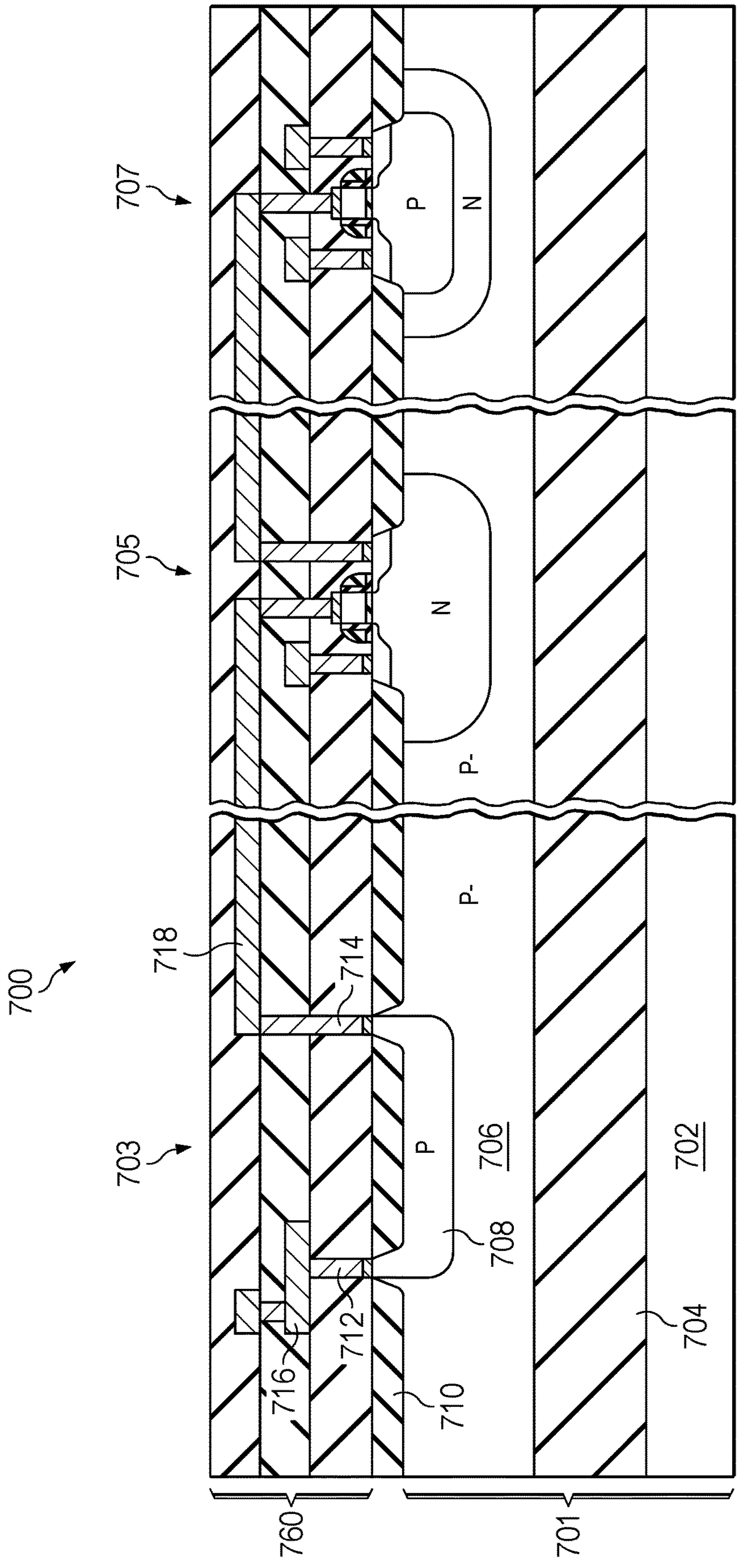
FIG. 7 is a side cross-section of a portion of an example integrated circuit that includes the ESD protection circuit of FIG. 2 or 5.

FIG. 6 is a flow diagram for a method 600 of fabricating an integrated circuit including an example of the ESD protection circuit 200 or the ESD protection circuit 500. Though depicted sequentially as a matter of convenience, at least some of the actions shown can be performed in a different order and/or performed in parallel. Additionally, some implementations may perform only some of the actions shown. FIG. 7 is a side cross-section of an example integrated circuit 700 fabricated according to the method 600.

In block 602, a semiconductor substrate 701 is provided. The semiconductor substrate 701 may include a handle layer 702, a buried oxide (BOX) layer 704, and an epitaxial layer 706. The handle layer 702 may be bulk silicon or other semiconductor material. The BOX layer 704, which may be omitted in some examples, may be a portion of a silicon-on-insulator (SOI) substrate. While the epitaxial layer 706 in the illustrated example is lightly doped p-type silicon (active silicon), the handle layer 702 and epitaxial layer 706 may be any other combinations of n-type or p-type material.

In block 604, components including transistors, resistors, capacitors, and other components are formed over or extending into the semiconductor substrate 701. FIG. 7 shows the integrated circuit 700 including a resistor 703, a p-type FET 705, and an n-type FET 707, which may be examples of the resistor 206, the transistor 204, and the transistor 202, respectively. The integrated circuit 700 may include additional transistors, resistors, capacitors, and other components as needed to implement the ESD protection circuit 200 or ESD protection circuit 500.

In block 606, interconnect layers and insulation layers (e.g., insulation layers 760) are formed. The interconnect layers may be patterned to form a power supply terminal (e.g., the power supply terminal 106), a reference terminal (e.g., the reference terminal 108), and vertical and horizontal interconnects (e.g., interconnects 712, 714, 716, 718) that connect the transistors, resistors, capacitor, and other components of the integrated circuit 700 to form the ESD protection circuit 200 or the ESD protection circuit 500.

In block 608, the interconnect layers may connect a first transistor of the integrated circuit 700 to the power supply terminal and the reference terminal. For example, in the interconnect layers, a drain terminal of the n-type FET 707 may be connected to the power supply terminal and a source terminal of the n-type FET 707 may be connected to the reference terminal. The interconnect layers may connect a second transistor of the integrated circuit 700 to the power supply terminal and a control terminal of the first transistor. For example, in the interconnect layers, a source terminal of the p-type FET 705 may be connected to the power supply terminal and a drain terminal of the p-type FET 705 may be connected to the gate terminal of the n-type FET 707. The interconnect layers may connect a third transistor of the integrated circuit 700 to the reference terminal and the control terminal of the first transistor (as per the transistor 220). The interconnect layers may connect a resistor of the integrated circuit 700 between the power supply terminal and a control terminal of the second transistor. For example, in the interconnect layers, a first terminal of the resistor 703 may be connected to the power supply terminal and a second terminal of the resistor 703 may connected to the gate terminal of the p-type FET 705. The interconnect layers may connect a capacitor of the integrated circuit 700 between the resistor and the reference terminal.

Additionally, each of the inter-component connections shown in FIG. 2 and FIG. 5 may be formed in the interconnect layers of the integrated circuit 700 to form the ESD protection circuit 200 or the ESD protection circuit 500.

Figure 8:
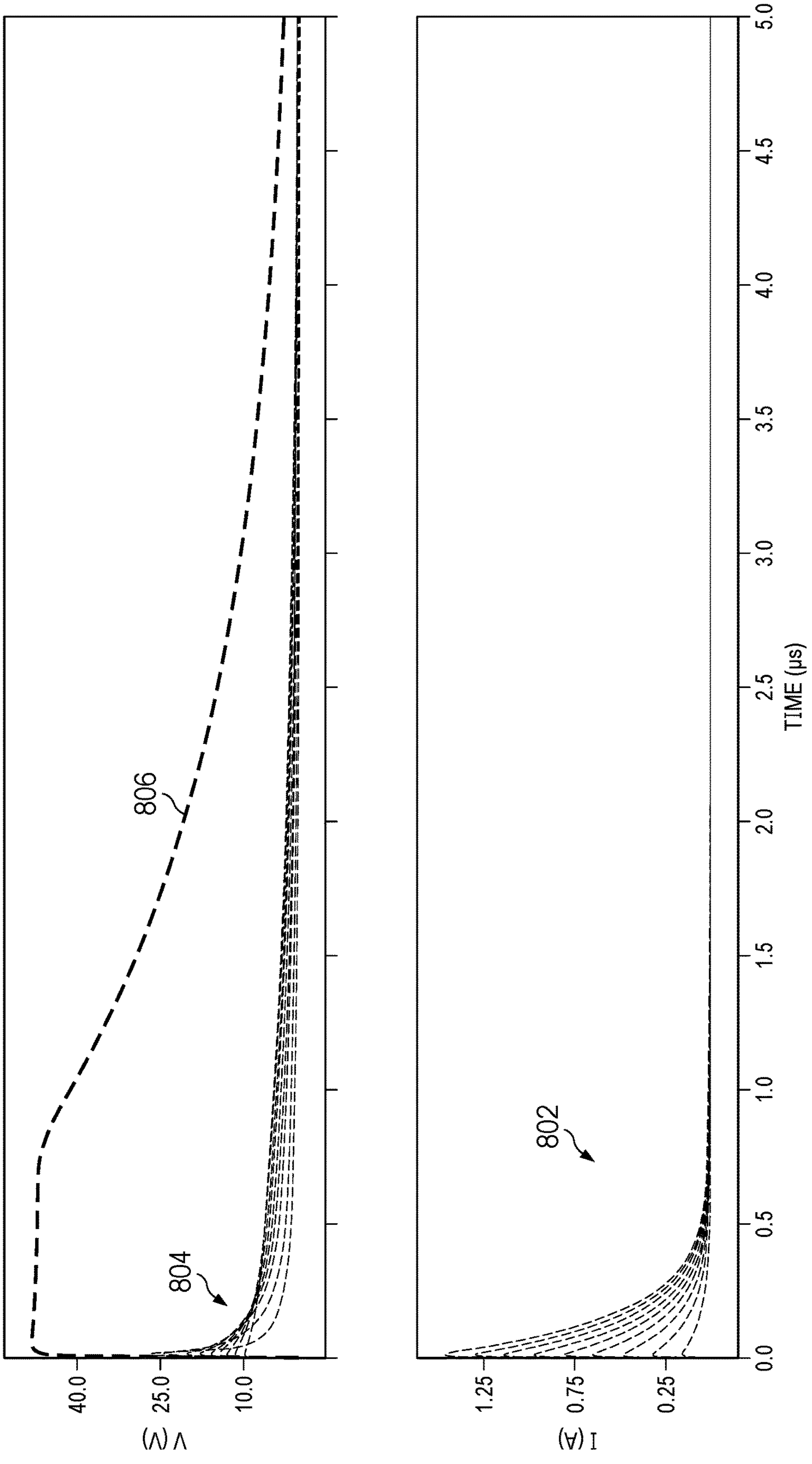
FIG. 8 is a graph of example clamping voltage in an integrated circuit using the ESD protection circuit of FIG. 2 or 5.

FIG. 8 is a graph of example clamping voltage in an integrated circuit using the ESD protection circuit 200 or the ESD protection circuit 500. In FIG. 8, the graph 802 shows current flow through the transistor 202 for multiple human body model ESD events of 250 to 2250 volts in 250 volt steps, and the graph 804 shows the gate-to-source voltage of the transistor 202 for the ESD events. The graphs 802 and 804 show that about 1.5 amperes of current flows through the transistor 202 during a 2250 volt ESD event, and the voltage across the transistor 202 is clamped to about 26 volts during the 2250 volt ESD event (clamp voltage is lower than 26 volts for lower voltage ESD events). For reference, the clamping voltage 806 of a representative breakdown-based ESD protection circuit during a 2250 volt ESD event is also shown in FIG. 8. The clamping voltage of the ESD protection circuit 200 and the ESD protection circuit 500 is about half that of the breakdown-based ESD protection circuit. Accordingly, the ESD protection of a circuit may be improved by using the ESD protection circuit 200 or the ESD protection circuit 500 as compared to the representative ESD protection circuit.

Figure 9:
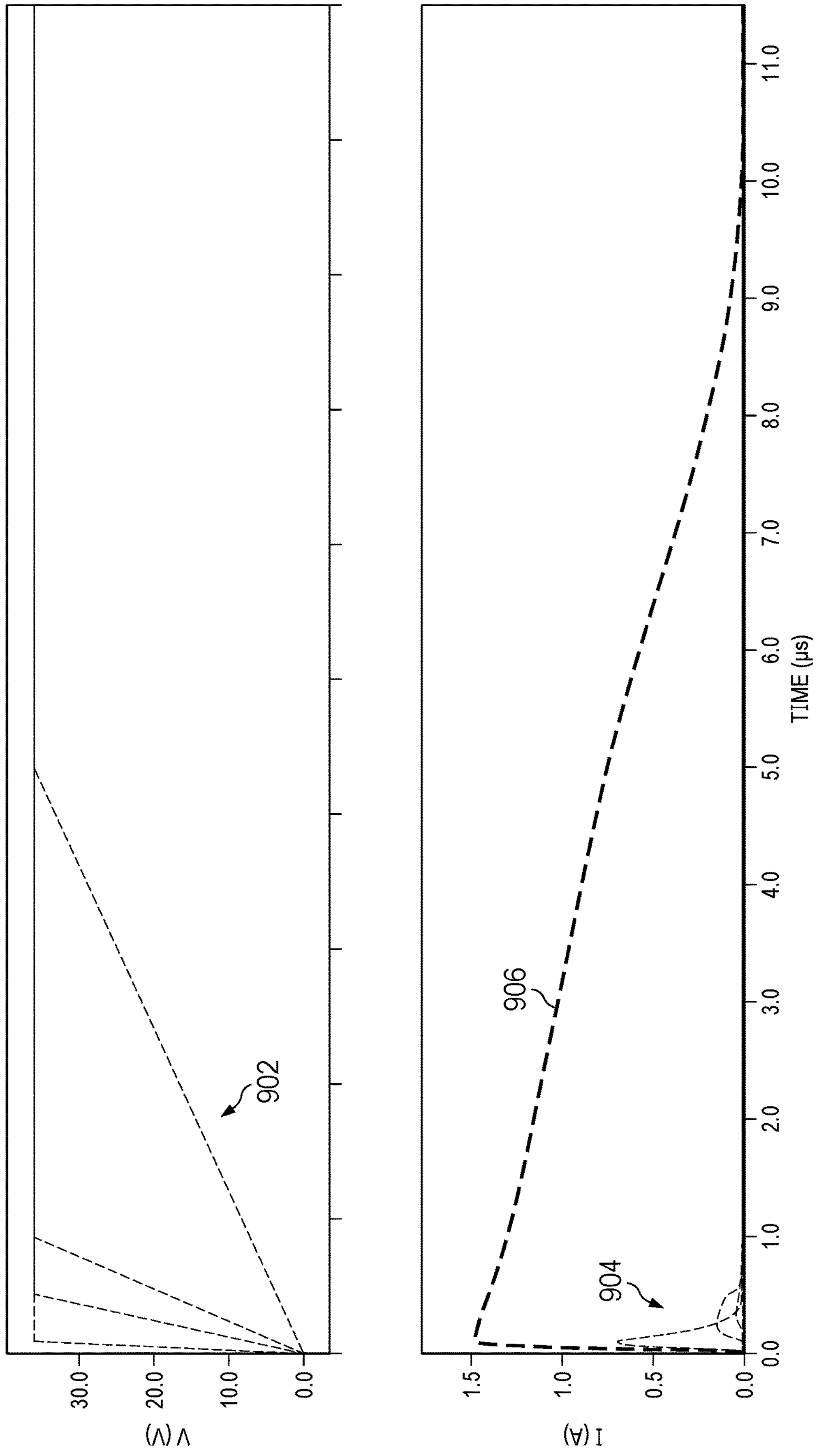
FIG. 9 is a graph of example current flow in the ESD protection circuit of FIG. 2 or 5 during power-up.

FIG. 9 is a graph of example current flow in the ESD protection circuit 200 or ESD protection circuit 500 during power-up. In FIG. 9, the graph 902 shows ramping of power supply voltage from zero volts to thirty-six volts in 100 nanoseconds, 500 nanoseconds, 1 microsecond, and 5 microseconds. The graph 904 shows the current flowing through the transistor 202 for each of the power supply ramps of the graph 902. For the 100 nanosecond ramp, about 700 milliamperes of current flows through the transistor 202 for less than 150 nanoseconds. For reference, the current 906 flowing through the representative ESD protection circuit during the 100 nanosecond ramp is also shown in FIG. 8. The current 906 is greater than 1 ampere for several microseconds. Accordingly, the current conducted by the ESD protection circuit 200 and the ESD protection circuit 500 during power-up is more than 90% less than the current conducted by the active ESD protection circuit, which can significantly reduce the likelihood of ESD protection circuit damage.

The same reference numbers or other reference designators are used in the drawings to designate the same or similar (either by function and/or structure) features.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described embodiments, and other embodiments are possible, within the scope of the claims.

What is claimed is:

1. An integrated circuit comprising:
- a first transistor having a first polarity type connected between a power supply terminal and a reference terminal, the first transistor having a first control terminal at a gate of the first transistor;
- a second transistor having an opposite second polarity type connected between the power supply terminal and the first control terminal, the second transistor having a second control terminal;
- a third transistor having the second polarity type connected between the first control terminal and the reference terminal, the third transistor having a third control terminal, the second transistor and the third transistor having a same conductivity type; and
- an RC circuit including a resistor and a capacitor connected to the second control terminal and configured to turn on the second transistor and turn off the third transistor responsive to a rise time of voltage of the power supply terminal being less than a predetermined threshold, thereby turning on the first transistor.

2. The integrated circuit of claim 1 wherein the resistor is connected to the power supply terminal and the second control terminal and the capacitor is connected between the second control terminal and the reference terminal.

3. The integrated circuit of claim 1 wherein the capacitor includes a reverse-biased Zener diode.

4. The integrated circuit of claim 1 wherein the resistor is a first resistor; and further comprising a fourth transistor and a second resistor, in which:
- the fourth transistor is coupled between the power supply terminal and the second resistor, the fourth transistor having a fourth control terminal connected to the second control terminal; and
- the second resistor is coupled between the fourth transistor and the reference terminal.

5. The integrated circuit of claim 4, further comprising:
- a fifth transistor and a third resistor, the fifth transistor including a fifth control terminal coupled to the second control terminal, in which:
- the fifth transistor is coupled between the power supply terminal and the third resistor; and
- the third resistor is coupled between the fifth transistor and the reference terminal.

6. The integrated circuit of claim 5, further comprising a sixth transistor coupled between the fifth transistor and the reference terminal, the sixth transistor having a sixth control terminal coupled to the second resistor.

7. The integrated circuit of claim 5, wherein the third control terminal is coupled to the fifth transistor and the third resistor.

8. The integrated circuit of claim 1, wherein the first transistor is an n-type extended-drain field effect transistor (FET), and the second and third transistors are p-type FETs.

9. The integrated circuit of claim 1, wherein the RC circuit is configured to produce a control voltage indicative of an electrostatic discharge event at the power supply terminal.

10. A method comprising:
- forming a first transistor having a first polarity type, and second and third transistors having an opposite second polarity type, a resistor, and a capacitor over or extending into a semiconductor substrate, the first transistor having a first control terminal at a gate of the first transistor, the second transistor having a second control terminal, and the third transistor having a third control terminal; and
- forming one or more interconnect layers and in the interconnect layers:
  - connecting the first transistor to a power supply terminal and to a reference terminal;
  - connecting the second transistor to the power supply terminal and to the first control terminal;
  - connecting the third transistor to the first control terminal and to the reference terminal;
  - connecting the resistor between the power supply terminal and the second control terminal; and
  - connecting the capacitor between the second control terminal and the reference terminal.

11. The method of claim 10, wherein the capacitor is implemented by a Zener diode.

12. The method of claim 10, wherein:
- the resistor is a first resistor; and
- the method includes:
  - providing a second resistor over or extending into the semiconductor substrate; and
  - in the interconnect layers:
    - connecting the second resistor between the third control terminal and the reference terminal.

13. The method of claim 12, further comprising:
- providing a fourth transistor and a fifth transistor over or extending into the semiconductor substrate, the fourth transistor having a fourth control terminal and the fifth transistor having a fifth control terminal; and
- in the interconnect layers:
  - connecting the fourth transistor between the power supply terminal and the third control terminal; and
  - connecting the fifth control terminal to the third control terminal.

14. The method of claim 13, further comprising:
- providing a sixth transistor over or extending into the semiconductor substrate, the sixth transistor having a sixth control terminal; and
- in the interconnect layers:
  - connecting the sixth transistor between the power supply terminal and the fifth control terminal; and
  - connecting the second resistor between the fifth control terminal and the reference terminal.

15. The method of claim 10, wherein the resistor and the capacitor are connected to form an RC circuit configured to produce a control voltage indicative of an electrostatic discharge event at the power supply terminal.

16. An integrated circuit comprising:
- a core circuit coupled between a power supply terminal and a reference terminal;
- an electro-static discharge (ESD) protection circuit coupled between the power supply terminal and the reference terminal, the ESD protection circuit including:
  - an ESD protection transistor connected between the power supply terminal and the reference terminal, the ESD protection transistor having a control terminal at a gate of the ESD protection transistor;
  - a first pull-down stage having a first transistor and a first resistor connected in series at a first node between the power supply terminal and the reference terminal, the first node connected to a control terminal of a pull-down transistor connected between the gate of the ESD protection transistor and the reference terminal; and a second pull-down stage having a second transistor and a second resistor connected in series at a second node between the power supply terminal and the reference terminal, the second node connected to a control terminal of a pull-up transistor connected between the gate of the ESD protection transistor and the power supply terminal.

17. The integrated circuit of claim 16, wherein the ESD protection circuit includes a capacitor coupled between the first resistor and the reference terminal.

18. The integrated circuit of claim 16, wherein the ESD protection circuit includes a Zener diode coupled between the first resistor and the reference terminal.

19. The integrated circuit of claim 16, wherein:

the first pull-down stage includes a third transistor having a third control terminal, in which:

the third transistor is connected between the reference terminal and the control terminal of the ESD protection transistor; and a control terminal of the third transistor is connected to the second node; and the second pull-down stage includes a fourth transistor having a fourth control terminal, in which:

the fourth transistor is connected between the reference terminal and the second node.

20. The integrated circuit of claim 19, wherein the ESD protection circuit includes:

a third pull-down stage including a fifth transistor and a third resistor connected in series at a third node between the power supply terminal and the reference terminal, the third node connected to a control terminal of the fourth transistor.

21. An integrated circuit comprising:

a first transistor having a first polarity type connected between a power supply terminal and a reference terminal, the first transistor having a first control terminal at a gate of the first transistor;

a second transistor having an opposite second polarity type connected between the power supply terminal and the first control terminal, the second transistor having a second control terminal;

a third transistor having the second polarity type connected between the first control terminal and the reference terminal, the third transistor having a third control terminal;

an RC circuit including a first resistor and a capacitor connected to the second control terminal and configured to turn on the second transistor and turn off the third transistor responsive to a rise time of voltage of the power supply terminal being less than a predetermined threshold, thereby turning on the first transistor; and a fourth transistor coupled between the power supply terminal and a second resistor, the fourth transistor having a fourth control terminal connected to the second control terminal, the second resistor coupled between the fourth transistor and the reference terminal.

* * * * *